(12) United States Patent
Yong et al.

(10) Patent No.: US 7,482,697 B2
(45) Date of Patent: Jan. 27, 2009

(54) DOUBLE-SIDED WAFFLE PACK

(75) Inventors: Soon Tatt Ow Yong, Penang (MY); Hsiang Wan Liau, Penang (MY); Yeow Guan Teh, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 132 days.

(21) Appl. No.: 11/461,960

(22) Filed: Aug. 2, 2006

(65) Prior Publication Data
US 2008/0029904 A1     Feb. 7, 2008

(51) Int. Cl.
*H01L 29/40*     (2006.01)
(52) U.S. Cl. ................. 257/778; 257/622; 257/E21.553
(58) Field of Classification Search ................. 257/778, 257/622, E21.553
See application file for complete search history.

(56) References Cited

U.S. PATENT DOCUMENTS 6,640,423 B1 * 11/2003 Johnson et al. ............... 29/740

* cited by examiner

*Primary Examiner*—Long K Tran
(74) *Attorney, Agent, or Firm*—Timothy M. Honeycutt

(57) ABSTRACT

Double-sided waffle packs and methods of using the same are provided. In one aspect, a waffle pack is provided that includes a body that has a first side and second side opposite the first side. The first side has a first cavity for enabling a semiconductor die to be seated therein when the body is in a first orientation. The second side has a second cavity for enabling a semiconductor die to be seated therein when the body is in a second orientation opposite the first orientation. The first cavity has a first footprint and the second cavity has a second footprint. The first and second footprints are substantially aligned vertically.

17 Claims, 9 Drawing Sheets

DOUBLE-SIDED WAFFLE PACK

BACKGROUND OF THE INVENTION

1. Field of the Invention

This invention relates generally to semiconductor processing, and more particularly to waffle packs to hold semiconductor die and to methods of using the same.

2. Description of the Related Art

Many current integrated circuits are formed as multiple die on a common wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. After the die is mounted to the substrate, a lid is attached to the substrate to cover the die. Some conventional integrated circuits, such as microprocessors, generate sizeable quantities of heat that must be ferried away to avoid device shutdown or damage. The lid serves as both a protective cover and a heat transfer pathway.

Before packaging, the cut die are provided with solder bumps and thereafter subjected to some form of visual inspection to verify that the solder bumps meet specifications. Accordingly, the die are positioned bump-up so that the bumps can be observed. After visual inspection, the die must be flipped over for flip-chip mounting on a substrate.

One conventional way of handling the cut die after bump deposition involves the use of a conventional single-sided waffle pack. The conventional waffle pack consists of a body that has a plurality of die-shaped cavities on one side and a large cavity on the opposite side. In the conventional method, die are loaded into the cavities bump-side up and a visual inspection is performed. In order to prepare for packaging, the die must next be flipped over to a bump-side down position. This entails flipping over an empty single-sided waffle pack and placing it on the loaded waffle pack. The inverted and upright waffle packs are not natively designed to mate up so a flipping jig is used to provide axial alignment. With the flipping jig in place, the inverted and upright waffle packs are lifted and flipped over. The flipping jig is removed and the formerly underlying upright waffle pack is lifted off to expose the die. A machine is then activated to lift out the bump-side down die and transport them for flip-chip mounting.

The difficulty with this method is that each loaded waffle pack must be flipped one at a time. Thus, the throughput is somewhat limited. Even with a flipping jig, axial alignment is sometimes imperfect. If there is misalignment between the inverted waffle pack and the loaded waffle pack, the die may jostle about as the stack is flipped, resulting in smearing or other damage to the solder bumps.

The present invention is directed to overcoming or reducing the effects of one or more of the foregoing disadvantages.

SUMMARY OF THE INVENTION

In accordance with one aspect of the present invention, a method of processing is provided that includes providing a first waffle pack. The first waffle pack includes a body that has a first side and second side opposite the first side. The first side has a first cavity for enabling a semiconductor die to be seated therein when the body is in a first orientation. The second side has a second cavity for enabling a semiconductor die to be seated therein when the body is in a second orientation opposite the first orientation. The first cavity has a first footprint and the second cavity has a second footprint. The first and second footprints are substantially aligned vertically. A second waffle pack is provided that includes a body that has a first side and second side opposite the first side. The first side has a first cavity for enabling a semiconductor die to be seated therein when the body is in a first orientation. The second side has a second cavity for enabling a semiconductor die to be seated therein when the body is in a second orientation opposite the first orientation. The first cavity has a first footprint and the second cavity has a second footprint. The first and second footprints are substantially aligned vertically. A first semiconductor die is placed in a first orientation in the first cavity of the first waffle pack. The second waffle pack is stacked on the first waffle pack such that the second cavity of the second waffle pack is substantially aligned vertically with the first cavity. The stack of the first and second waffle packs is flipped over so that the first semiconductor die flips over and moves into the second cavity of the second waffle pack. The first waffle pack is removed from the second waffle pack.

In accordance with another aspect of the present invention, a method of processing is provided that includes providing a first waffle pack that includes a body that has a first side and second side opposite the first side. The first side of the body has a first plurality of cavities for enabling a corresponding plurality of semiconductor die to be seated in the first plurality of cavities when the body is in a first orientation. The second side has a second plurality of cavities for enabling a second corresponding plurality of semiconductor die to be seated in the second plurality of cavities when the body is in a second orientation opposite the first orientation. The first and second pluralities of cavities form pairs of cavities wherein one cavity in a given pair having a first footprint and the other cavity in the given pair having a second footprint and the first and second footprints are substantially aligned vertically. A second waffle pack is provided that includes a body that has a first side and second side opposite the first side. The first side of the body has a first plurality of cavities for enabling a corresponding plurality of semiconductor die to be seated in the first plurality of cavities when the body is in a first orientation. The second side has a second plurality of cavities for enabling a second corresponding plurality of semiconductor die to be seated in the second plurality of cavities when the body is in a second orientation opposite the first orientation. The first and second pluralities of cavities form pairs of cavities wherein one cavity in a given pair has a first footprint and the other cavity in the given pair has a second footprint, and the first and second footprints are substantially aligned vertically. A first plurality of semiconductor die is placed in a first orientation in respective cavities of the first plurality of cavities of the first waffle pack. The second waffle pack is stacked on the first waffle pack such that the second plurality of cavities of the second waffle pack are substantially aligned vertically with the first plurality of cavities of the first waffle pack. The stack of the first and second waffle packs is flipped over so that the first plurality of semiconductor die flip over and move into the plurality of second cavities of the second waffle pack. The first waffle pack is removed from the second waffle pack.

In accordance with another aspect of the present invention, a waffle pack is provided that includes a body that has a first side and second side opposite the first side. The first side has a first cavity for enabling a semiconductor die to be seated therein when the body is in a first orientation. The second side has a second cavity for enabling a semiconductor die to be seated therein when the body is in a second orientation opposite the first orientation. The first cavity has a first footprint and the second cavity has a second footprint. The first and second footprints are substantially aligned vertically.

In accordance with another aspect of the present invention, a waffle pack is provided that includes a body that has a first side and second side opposite the first side. The first side of the body has a first plurality of cavities for enabling a corresponding plurality of semiconductor die to be seated in the first plurality of cavities when the body is in a first orientation. The second side has a second plurality of cavities for enabling a second corresponding plurality of semiconductor die to be seated in the second plurality of cavities when the body is in a second orientation opposite the first orientation. The first and second pluralities of cavities form pairs of cavities. One cavity in a given pair has a first footprint and the other cavity in the given pair has a second footprint. The first and second footprints are substantially aligned vertically.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
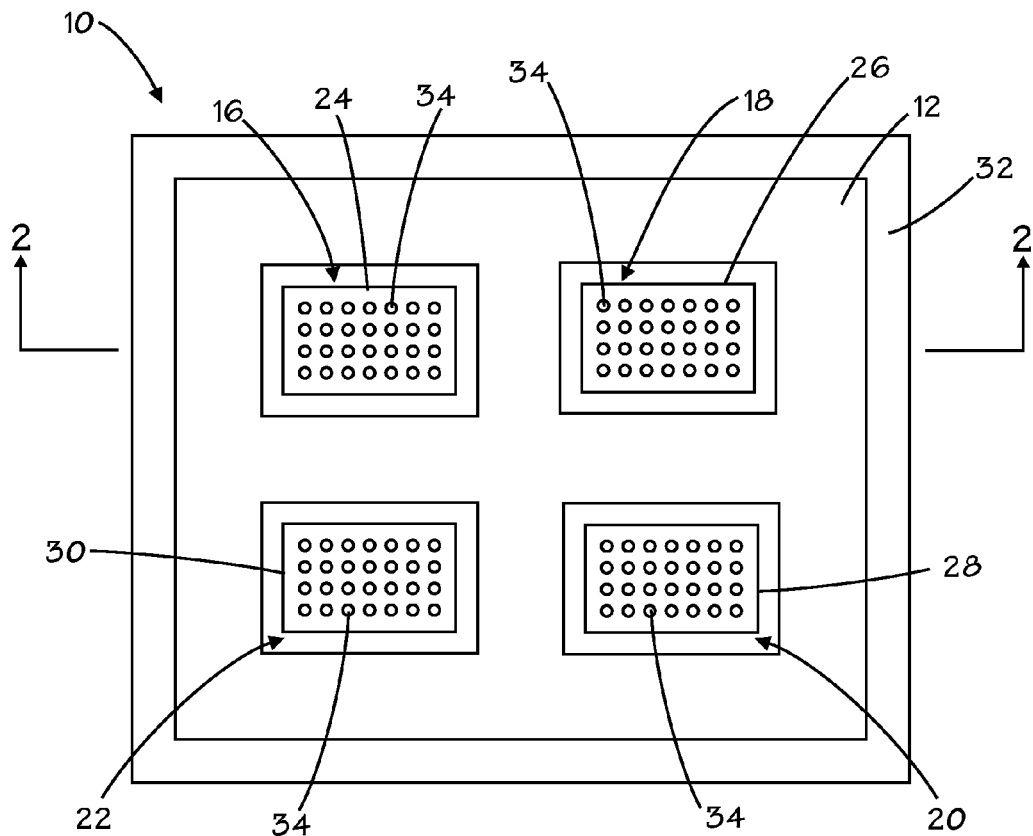
FIG. 1 is a top view of an exemplary conventional single-sided waffle pack.
Figure 2:
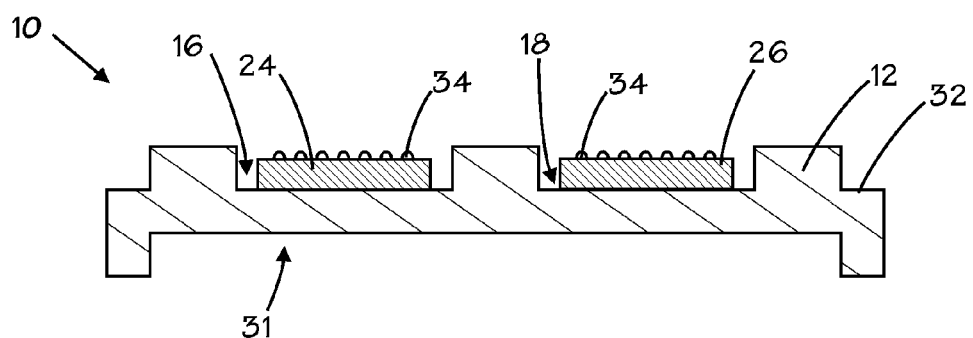
FIG. 2 is a cross-sectional view of FIG. 1 taken at section 2-2.

In the drawings described below, reference numerals are generally repeated where identical elements appear in more than one figure. Turning now to the drawings, and in particular to FIG. 1, therein is shown a top view of an exemplary conventional single-sided chip carrier or waffle pack 10. The waffle pack 10 has an upper side 12 and a lower side 14. The lower side 14 is visible in FIG. 2, which is a cross-sectional view of FIG. 1 taken at section 2-2. The upper side 12 is provided with four cavities 16, 18, 20 and 22. Note that because of the location of the section 2-2, only the cavities 16 and 18 are visible in FIG. 2. The cavities 16, 18, 20 and 22 are provided to house one or more semiconductor chips or die 24, 26, 28 and 30. The cavities 16, 18, 20 and 22 have the same general shape or footprint as the die 24, 26, 28 and 30. Referring now to FIG. 2, the lower side 14 of the waffle pack 10 is provided with a single large rectangular cavity 31. Referring again to both FIGS. 1 and 2, the upper surface 12 is provided with an upwardly facing peripheral shoulder 32. The purpose of the shoulder 32 will be described elsewhere herein.

Note that the die 24, 26, 28 and 30 are provided with respective pluralities of solder bumps 34 that are designed to form ohmic connections with a mounting board or substrate (not shown). The die 24, 26, 28 and 30 are initially positioned in their respective cavities 16, 18, 20 and 22 with the bumps 34 facing upward as shown in FIGS. 1 and 2.

Figure 3:
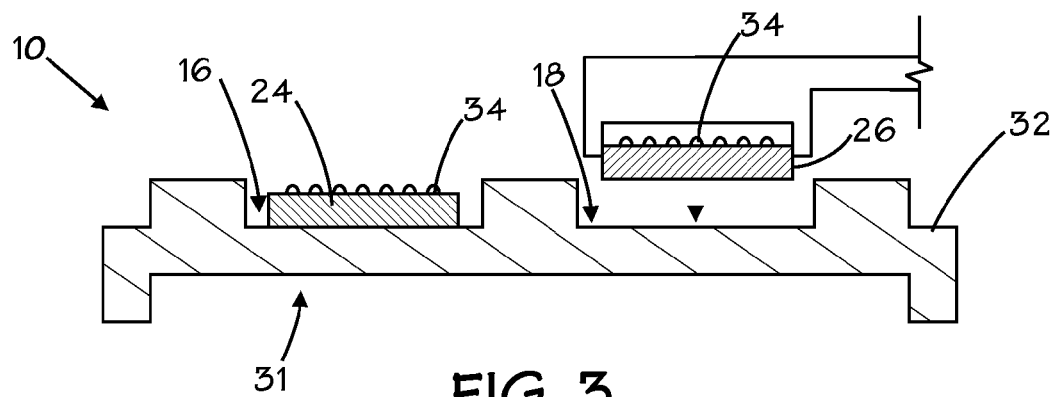
FIG. 3 is a sectional view like FIG. 3 depicting placement of semiconductor die on the conventional waffle pack.
Figure 4:
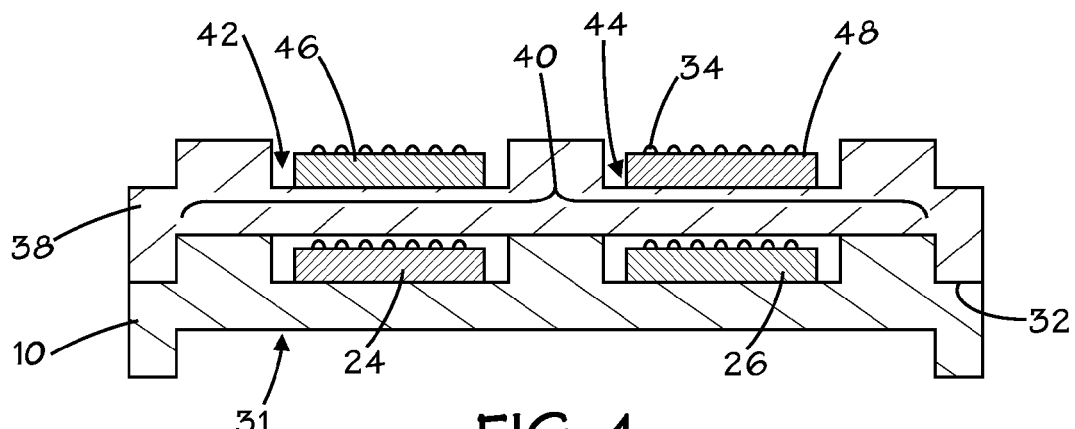
FIG. 4 is a sectional view like FIG. 3 depicting stacking of two conventional waffle packs.

As noted above, the die 24 and 26 are initially placed in the cavities 16 and 18 bumps-side-up, i.e., with the bumps 34 facing up as shown in FIG. 3. The placement of the die 24 and 26 is by way of a pick and place device 36, or a chip sorting machine or other type of device. The die 24 and 26 are initially positioned in the cavities 16 and 18 bump-side-up so that the solder bumps 34 may be visually inspected for defects. After the waffle pack 10 is loaded with die 24 and 26, the upper peripheral shoulder 32 serves as a seating surface upon which a second waffle pack 38 may be positioned as shown in FIG. 4. The second waffle pack 38 includes a lower surface cavity 40 that is substantially identical to the lower surface cavity 31 and the lower surface cavity 40 is sized so that the waffle pack 38 may seat on the upper peripheral shoulder 32. Since the waffle pack 38 is substantially identical to a waffle pack 10, the waffle pack 38 is provided with a plurality of cavities 42 and 44 to accommodate additional die 46 and 48 as shown.

Figure 5:
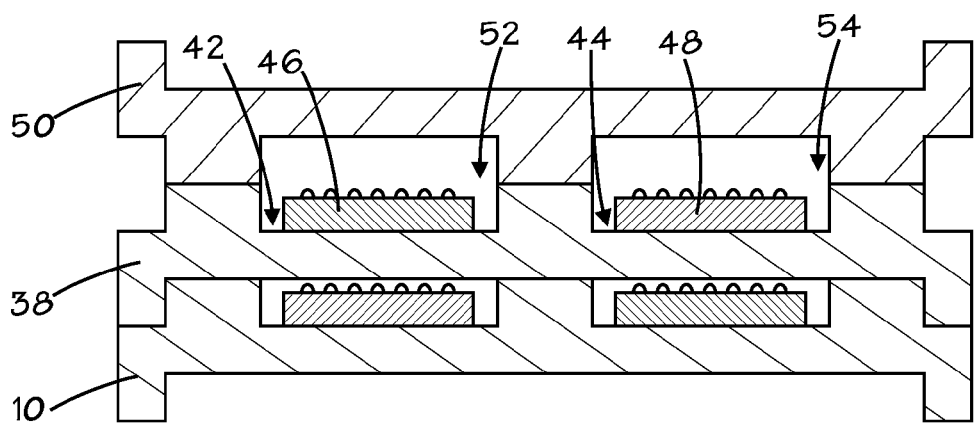
FIG. 5 is a sectional view like FIG. 4 depicting addition of an empty single-sided conventional waffle pack to the stack depicted in FIG. 4.

While the positioning of the die 24, 26, 46 and 48 bump-side-up is convenient from a bump inspection perspective, it is also inconvenient from an ultimate substrate mounting perspective. Indeed, the die 24, 26, 46 and 48 must be flipped over to a bump-side-down position for subsequent flip-chip mounting to packages or substrates as the case may be. This flipping operation is illustrated in FIGS. 5, 6, 7, 8 and 9. Referring initially to FIG. 5, assume for the purpose of this example, that it is desired to flip over the die 46 and 48 positioned in the cavities 42 and 44 of the waffle pack 38. Initially, an empty waffle pack 50 that is substantially identical to the waffle packs 38 and 10, is flipped over and positioned on top of the waffle pack 38 as shown in FIG. 5. It is desirable for the cavities 52 and 54 of the waffle pack 50 to align as closely as possible axially with the cavities 42 and 44 of the waffle pack 38. The goal is to be able to lift off the combination of the waffle packs 50 and 38 from the waffle pack 10.

Figure 6:
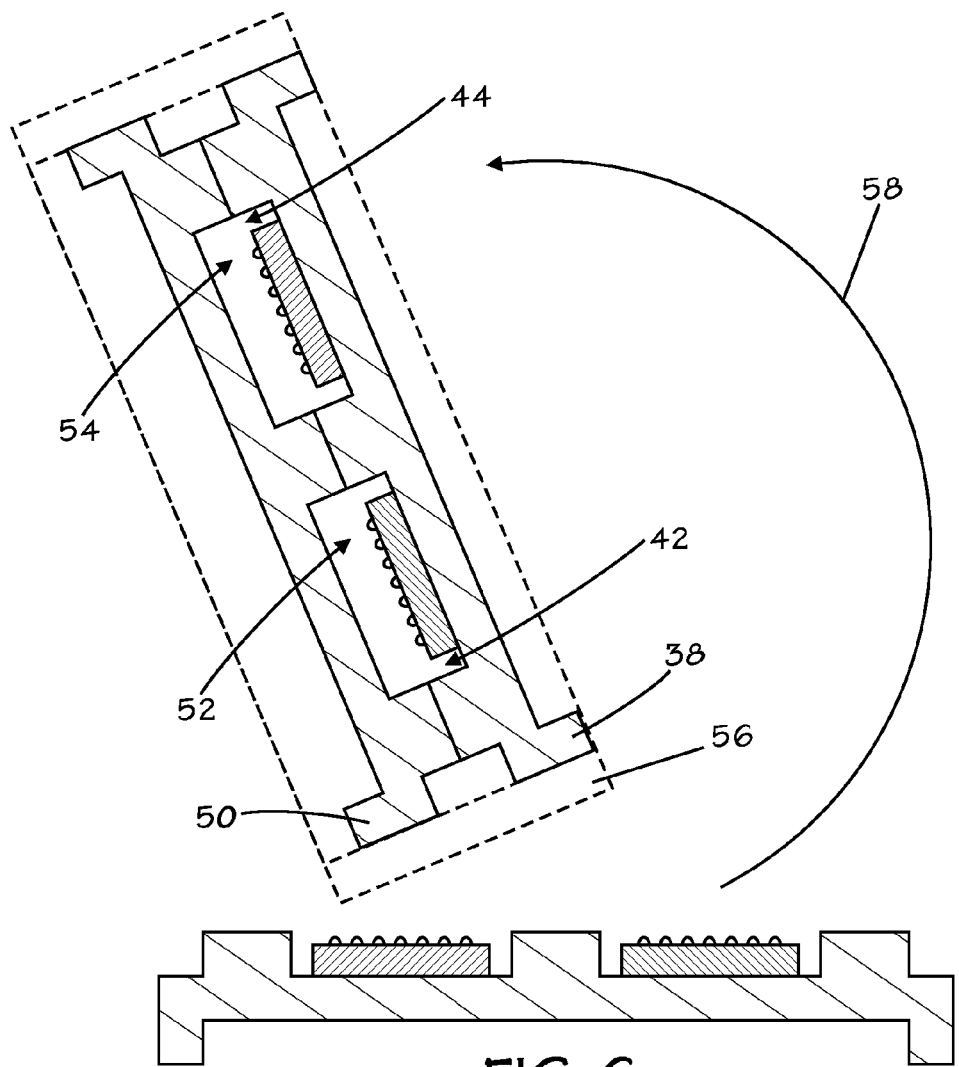
FIG. 6 is a sectional view like FIG. 5 depicting the jig-assisted flipping of two of the conventional waffle packs.
Figure 7:
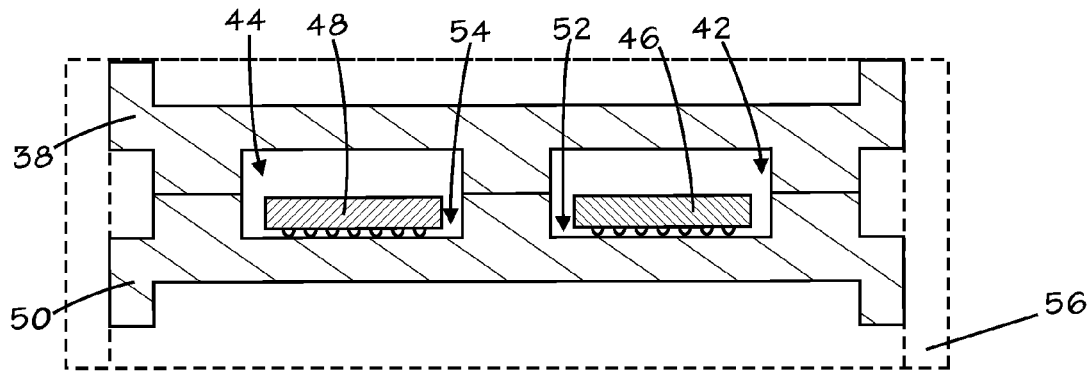
FIG. 7 is a sectional view depicting the flipped over combination of the empty and one of the conventional waffle packs.

The flipping step is illustrated in FIG. 6. In order to maintain axial alignment of the waffle packs 50 and 38, a flipping jig 56 is fitted over the waffle packs 38 and 50 and the combination of the flipping jig 56, and the waffle packs 50 and 38 are rotated off the waffle pack 10 as suggested by the arrow 58. As the combination of the jig 56 and the waffle packs 38 and 50 are rotated over, the die 46 and 48 flop from the cavities 42 and 44 of the waffle pack 38 into the cavities 52 and 54 of the waffle pack 50 bump-side-down as shown in FIG. 7. Since the combined volumes of the cavities 44 and 54 and 42 and 52, are somewhat larger than the die 48 and 46, the act of flipping over the combination of the jig 56 and the waffle packs 50 and 38 results in some jostling of the die 48 and 46, which, as noted above, in the Background Section hereof can produce some smearing of the solder bumps 34.

Figure 8:
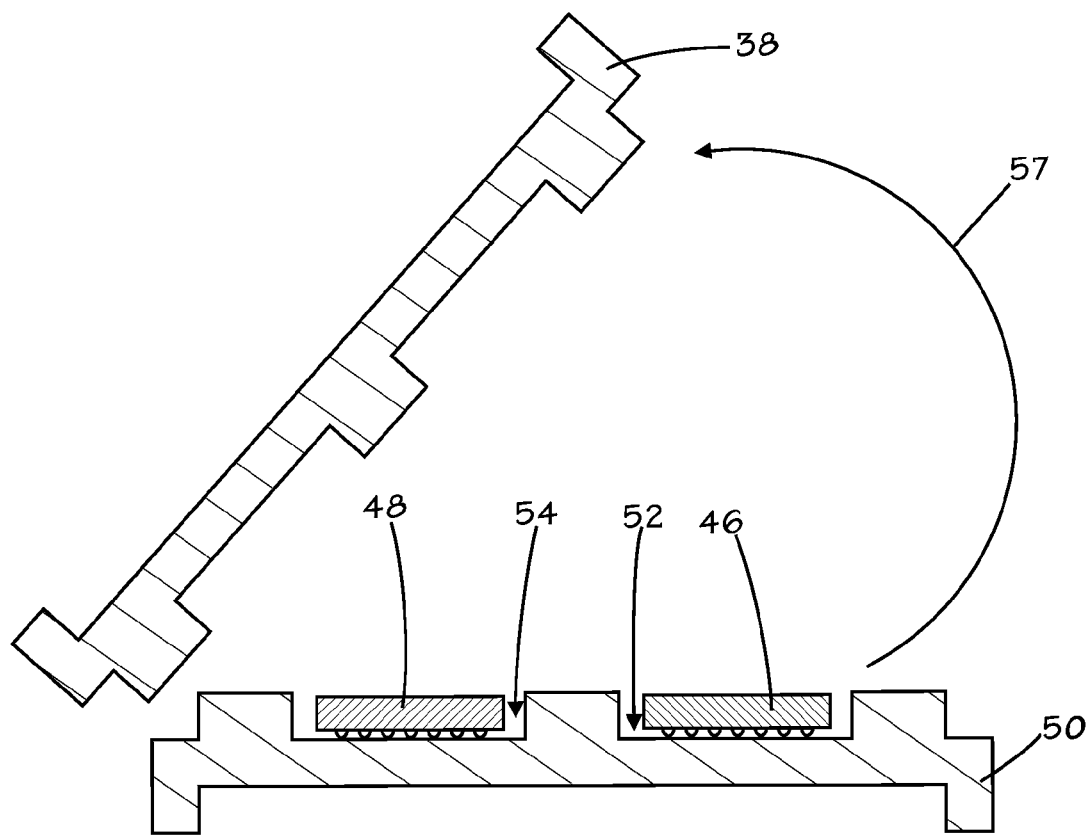
FIG. 8 is a sectional view like FIG. 7 depicting the removal of the formerly underlying waffle pack.
Figure 9:
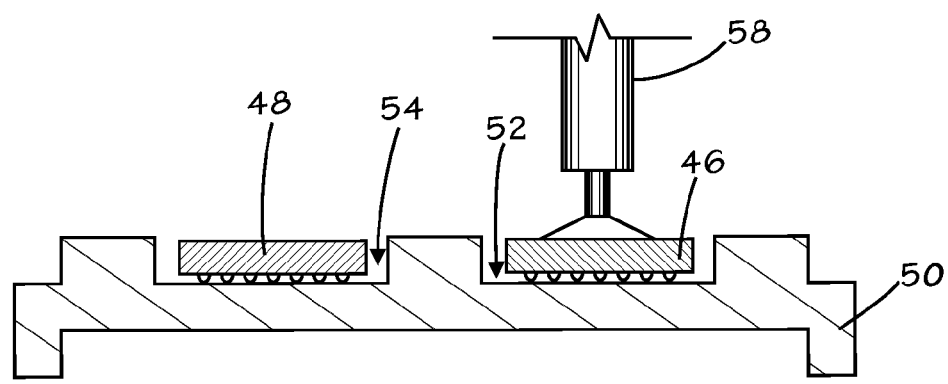
FIG. 9 is a sectional view like FIG. 8 depicting removal of the semiconductor die from the formerly empty conventional waffle pack.

Referring now to FIG. 8, the jig 56 shown in FIG. 7 is removed and the waffle pack 38 is lifted from the waffle pack 50 as suggested by the arrow 57 to expose the cavities 54 and 52 and the die 48 and 46 seated therein. Next, and as shown in FIG. 9, with the die 48 and 46 exposed, a pick and place device 58 may be used to lift the die 48 and 46 out of the cavities 54 and 52 and move them to some other position for further processing as necessary. The process just described in conjunction with FIGS. 5, 6, 7, 8 and 9 is then repeated for the waffle pack 10 depicted in FIG. 6 and any other waffle packs that may be positioned below the waffle pack 10 in a stack thereof. As noted elsewhere herein, the requirement for flipping one waffle pack at a time limits throughput.

Figure 10:
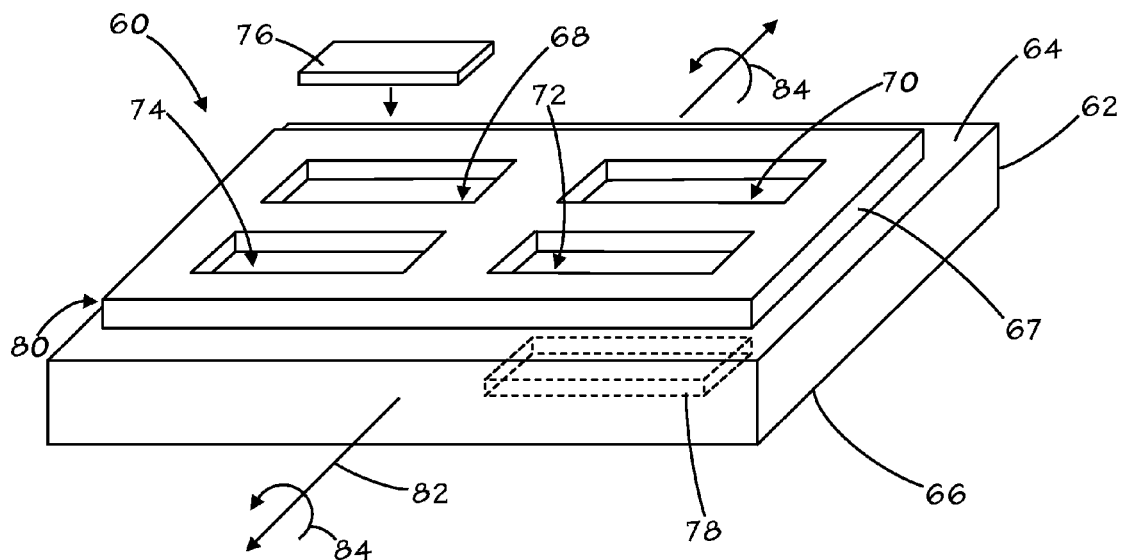
FIG. 10 is a pictorial view of an exemplary embodiment of a double-sided waffle pack in accordance with the present invention.

An exemplary embodiment of a double-sided waffle pack 60 may be understood by referring initially to FIG. 10, which is a pictorial view of the waffle pack 60 in an upright orientation. The waffle pack 60 includes a body 62 that has an upper side 64 and a lower side 66. The spatial terms "upper," "lower," "upright" are used herein merely for convenience since the waffle pack 60 may and is flipped over during use. The upper side 64 includes a step 65 in which four cavities 68, 70, 72 and 74 are provided. The cavities 68, 70, 72 and 74 are designed to receive respective semiconductor die, such as the semiconductor die 76 slated to be seated in the cavity 68, when the body 62 is in the upright orientation as is illustrated. Each of the cavities 68, 70, 72 and 74 has a footprint of a particular shape and size. In this illustrative embodiment, the footprints of the cavities 68, 70, 72 and 74 are rectangular and sized to be slightly larger in length and width than the die 76. The depth of each of the cavities is slightly larger than the depth of the die 76.

The lower side 66 of the waffle pack 60 is provided with additional cavities, one of which is labeled 78 and shown in phantom in FIG. 10. The cavity 78 is provided with a footprint that is substantially aligned vertically with the footprint of a corresponding cavity in the upper side 62, namely the cavity 72. Again, the term "vertically" is used here for convenience. The skilled artisan will appreciate that the term "laterally" could just as easily be used to describe the spatial relationship between the cavities 78 and 72 if the body were flipped up by say 90°. The purpose of the cavity alignment will be described in more detail below.

Figure 11:
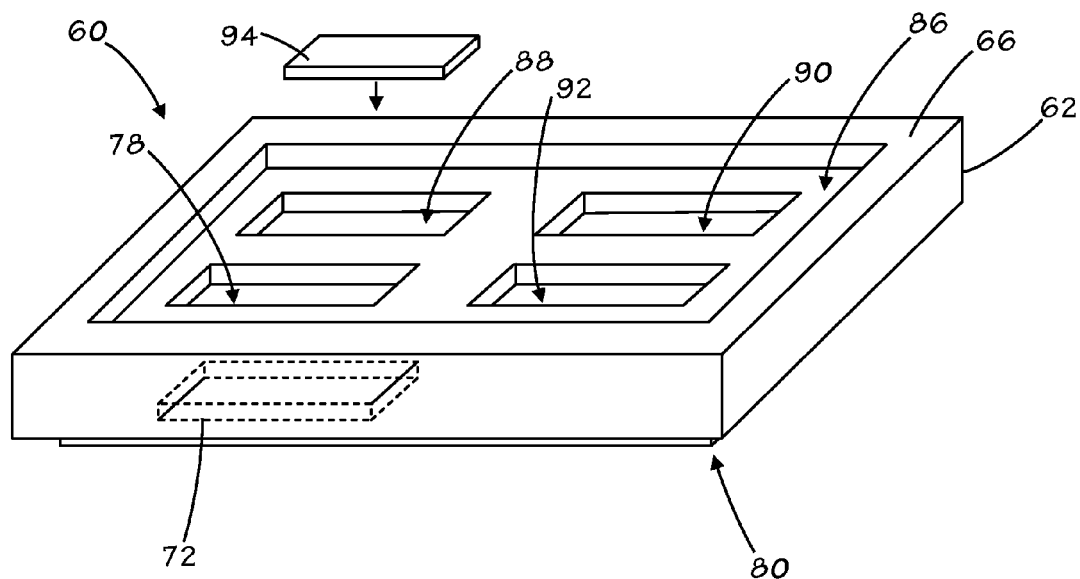
FIG. 11 is a pictorial view of the reverse side of the double-sided waffle pack depicted in FIG. 10 in accordance with the present invention.

Additional detail regarding the structure of the waffle pack 60 will now be described in conjunction with FIG. 11, which is a pictorial view of the waffle pack 60 flipped over in a orientation opposite to that shown in FIG. 10. Before considering FIG. 11, it will be instructive to remain focused momentarily on FIG. 10 and observe that a corner of the step 67 is labeled 80 and the waffle pack 60 is rotated about the axis 82 in the direction of the arrows 84 to produce the flipped over orientation shown in FIG. 11. Referring now to FIG. 11, note that the corner 80 is flip-flopped from the position depicted in FIG. 10. The lower side 66 includes a cavity or step-down 86. Unlike the conventional single sided waffle pack 10 depicted in FIGS. 1-9, the waffle pack 60 is provided with cavities 78, 88, 90 and 92 on the underside 66, and in particular at the step-down 86. The cavities 78, 88, 90 and 92 are designed to receive respective semiconductor die, such as the semiconductor die 94 slated to be seated in the cavity 68, when the body 62 is in the flipped orientation as illustrated. Note that the cavity 72 that is substantially aligned vertically with the cavity 78 is now obscured and thus shown in phantom in FIG. 11. Each of the cavities 78, 88, 90 and 92 has a footprint of a particular shape and size that matches up size-wise and spatially with the footprint of the one of the cavities 68, 70, 72 and 74 with which it is substantially aligned vertically. In this illustrative embodiment, the footprints of the cavities 78, 88, 90 and 92 are rectangular and sized to be slightly larger in length and width than the die 94. The depth of each of the cavities 78, 88, 90 and 92 is slightly larger than the depth of the die 94.

The step-down 86 itself has the same general footprint, albeit slightly larger in size, than the footprint of the step 67 to facilitate stacking of multiple waffle packs. The step-down 86 can receive the step of another identical waffle pack and vice-versa. Together, the step-down 86 of a waffle pack and the step of another provide structures that engage each other to provide a built-in axial alignment capability.

The waffle pack 60 may be composed of well-known plastics, metallic materials, combinations of these or the like. Plastics have the benefit of being relatively inert chemically, electrically insulating, light weight and inexpensive.

Figure 12:
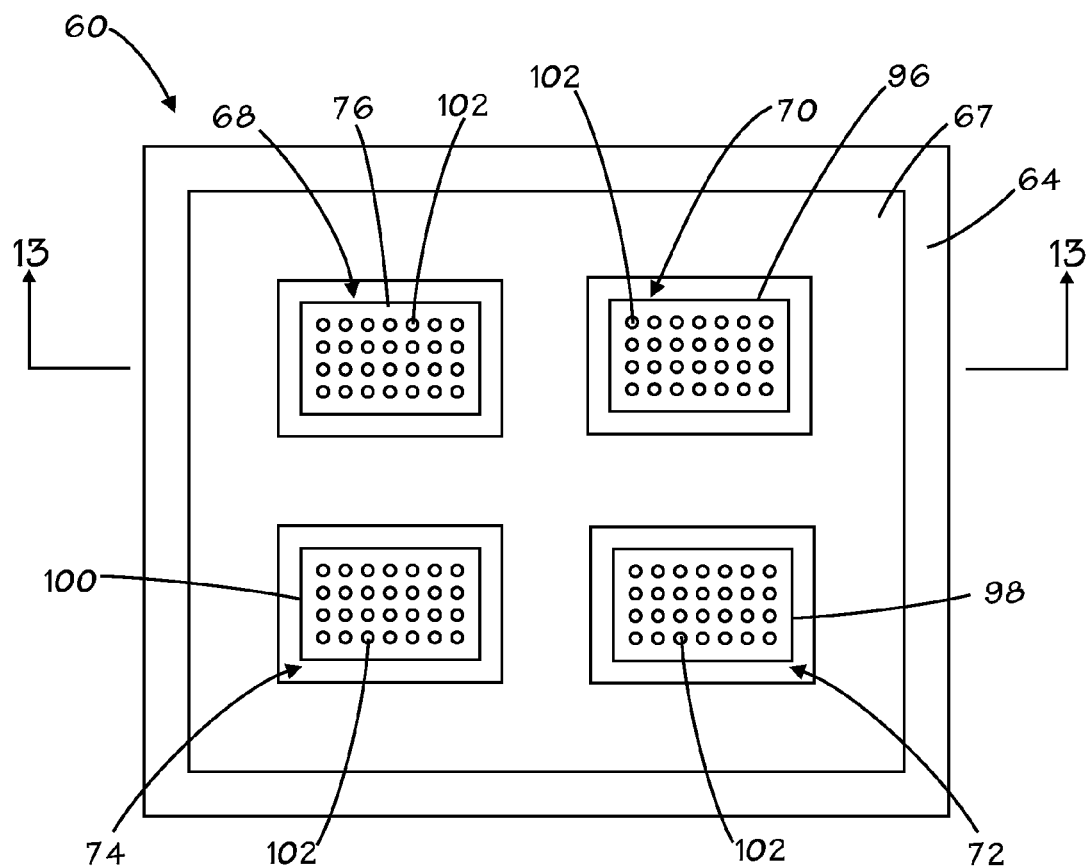
FIG. 12 is a top view of the exemplary embodiment of the double-sided waffle pack depicted in FIG. 10 in accordance with the present invention.
Figure 13:
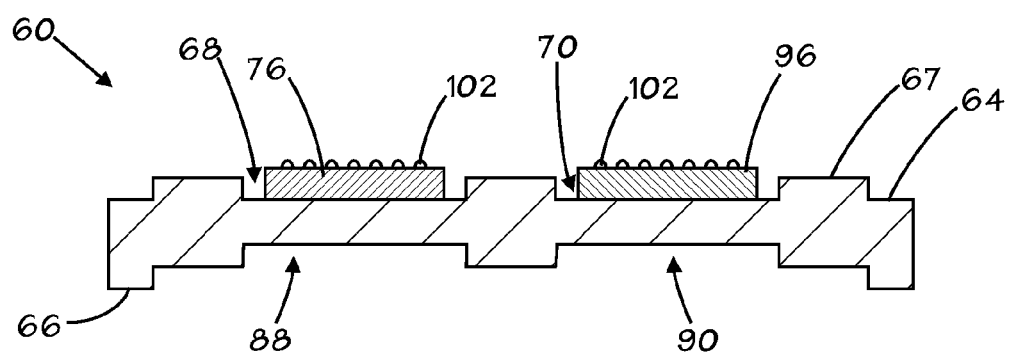
FIG. 13 is a sectional view of FIG. 12 taken at section 13-13.

The benefits of providing the waffle pack 60 with cavities 68, 70, 72 and 74 on one side 64 and cavities 78, 88, 90 and 92 on the other side 66 will now be described in conjunction with FIGS. 12, 13, 14, 15, 16, 17 and 18. Attention is turned initially to FIG. 12, which is a plan view of the waffle pack 60, and to FIG. 13, which is a sectional view of FIG. 12 taken at section 13-13. The upper side 64 and step 67 are visible along with the cavities 68, 70, 72 and 74. In one exemplary process flow, the cavities 68, 70, 72 and 74 receive respective die 76, 96, 98 and 100 initially in the bump-side-up position as shown in FIGS. 12 and 13. The die 76, 96, 98 and 100 may be positioned in the cavities 68, 70, 72 and 74 by way of any mechanism, such as, for example, the pick and place mechanism 36 depicted in FIG. 3 or a chip sorting machine or other type of mechanism. The die 76, 96, 98 and 100 are initially positioned as shown so that the respective solder bumps 102 of the die 76, 96, 98 and 100 may be visually inspected. Of course, the waffle pack could optionally be flipped over with the lower side 66 facing up and the die 76, 96, 98 and 100 loaded into the cavities 78, 88, 90 and 92 (note that only the cavities 88 and 90 are visible in FIG. 13).

Figure 14:
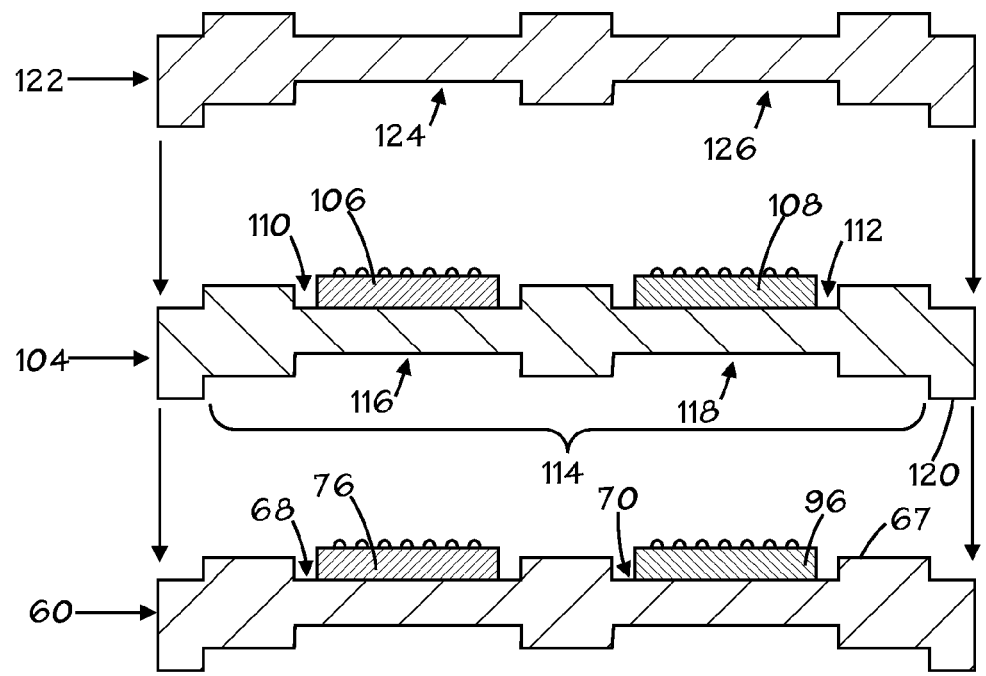
FIG. 14 is a sectional view depicting stacking of multiple double-sided waffle packs in accordance with the present invention.

The manipulation of the waffle pack 60 and additional waffle packs for the movement of die will be described in conjunction with FIGS. 14, 15, 16 and 17. It should be noted that only two cavities and die will be visible in the sectional views. However, the discussion is applicable to any number of cavities and die. Referring initially to FIG. 14, after the waffle pack 60 is loaded with die 76 and 96, a substantially identical waffle pack 104 may be seated on the waffle pack 60 and additional die 106 and 108 may be seated in cavities 110 and 112 of the waffle pack 104. A step-down 114 of the waffle pack 104 engages the step 67 of the waffle pack 60. This engagement acts as an axial alignment mechanism for the waffle packs 60 and 104. The engagement of the shoulders 110 and 92 also. Optionally, a flipping jig of the type described elsewhere herein may be used to facilitate the axial alignment of the waffle packs 60 and 100. The cavities 116 and 118 in the lower surface 120 of the waffle pack 104 join, respectively, with the cavities 68 and 70 to provide enclosures with relatively small vertical clearances for the die 76 and 96 when the waffle pack 104 is stacked on the waffle pack 60. This relatively small vertical clearance is designed to avoid the kind of unwanted vertical jostling that can occur using the conventional waffle pack depicted in FIGS. 1, 2 and 3.

Figure 15:
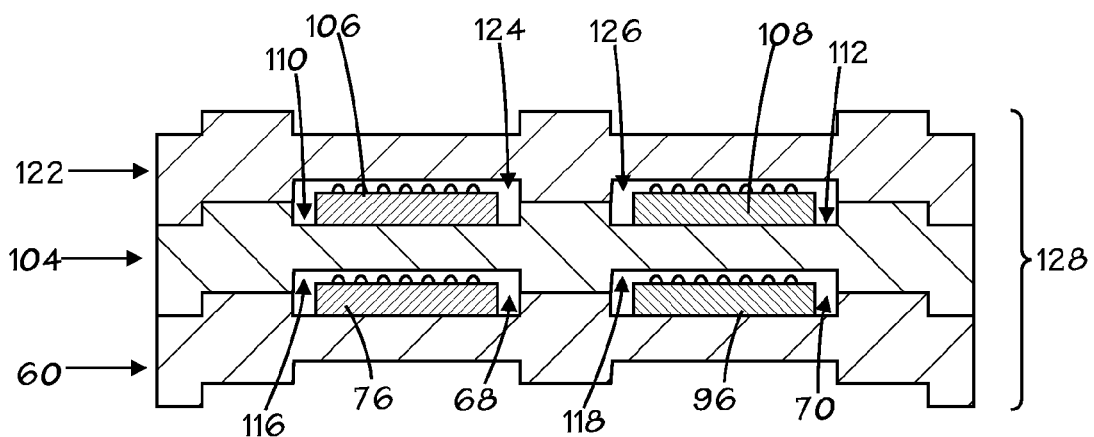
FIG. 15 is a sectional view like FIG. 14 depicting the stacked double-sided waffle packs in accordance with the present invention.
Figure 16:
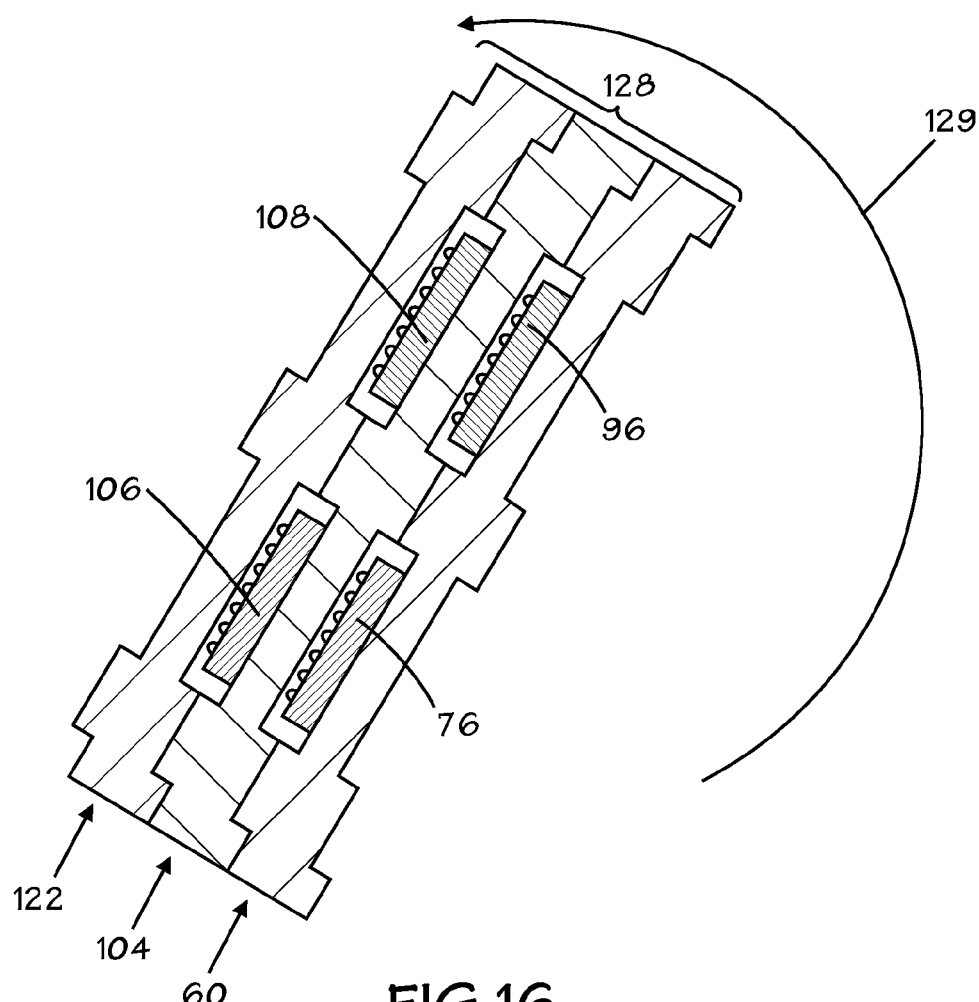
FIG. 16 is a sectional view like FIG. 15 but depicting the flipping of the stack of double-sided waffle packs in accordance with the present invention.
Figure 17:
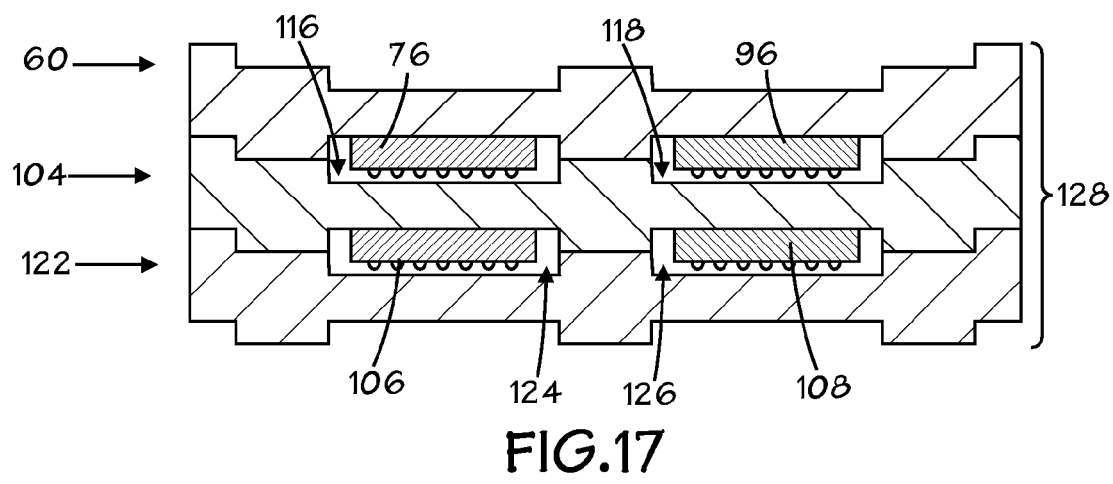
FIG. 17 is a sectional view depicting the flipped stack of double-sided waffle packs in accordance with the present invention.

After the loading of the cavities 110 and 112 with the die 106 and 108, another substantially identical waffle pack 122 with cavities 124 and 126 may be positioned on the waffle pack 104 in the manner just described for the waffle pack 104 to produce a stack 128 shown in FIG. 15. The resulting stack 128 of the waffle packs 60, 104 and 122 may be added to with additional waffle packs as desired. At this stage, the die 76, 96, 106 and 108 are seated in cavities 68, 70, 110 and 112, respectively, but are enclosed by the respective combinations of cavities 68 and 116, 70 and 118, 110 and 124, and 126 and 112. As noted elsewhere herein in conjunction with the conventional single sided waffle pack 10, it is necessary to flip the die over into a bump-side-down orientation so that the die can be removed from the waffle packs 60 and 104 and moved to a subsequent stage of processing. In the conventional single sided waffle pack 10, this required a separate operation for each of the single sided waffle packs 10 and 38. However, the stack 128 of waffle packs 60, 104 and 122 and their enclosed die 76, 96, 106 and 108 in the present embodiment may be flipped over en masse as suggested by the arrow 129 shown in FIG. 16 into the flipped over position shown in FIG. 17 all in one operation. Thus, and as shown in FIG. 17, the die 76, 96, 106 and 108 are all flipped over into a bump side down orientation in a single step. At this stage, the die 76 and 96 are seated, respectively, in the cavities 116 and 118 of the waffle pack 104. The die 106 and 108 are seated, respectively, in the cavities 124 and 126 of the waffle pack 122.

Figure 18:
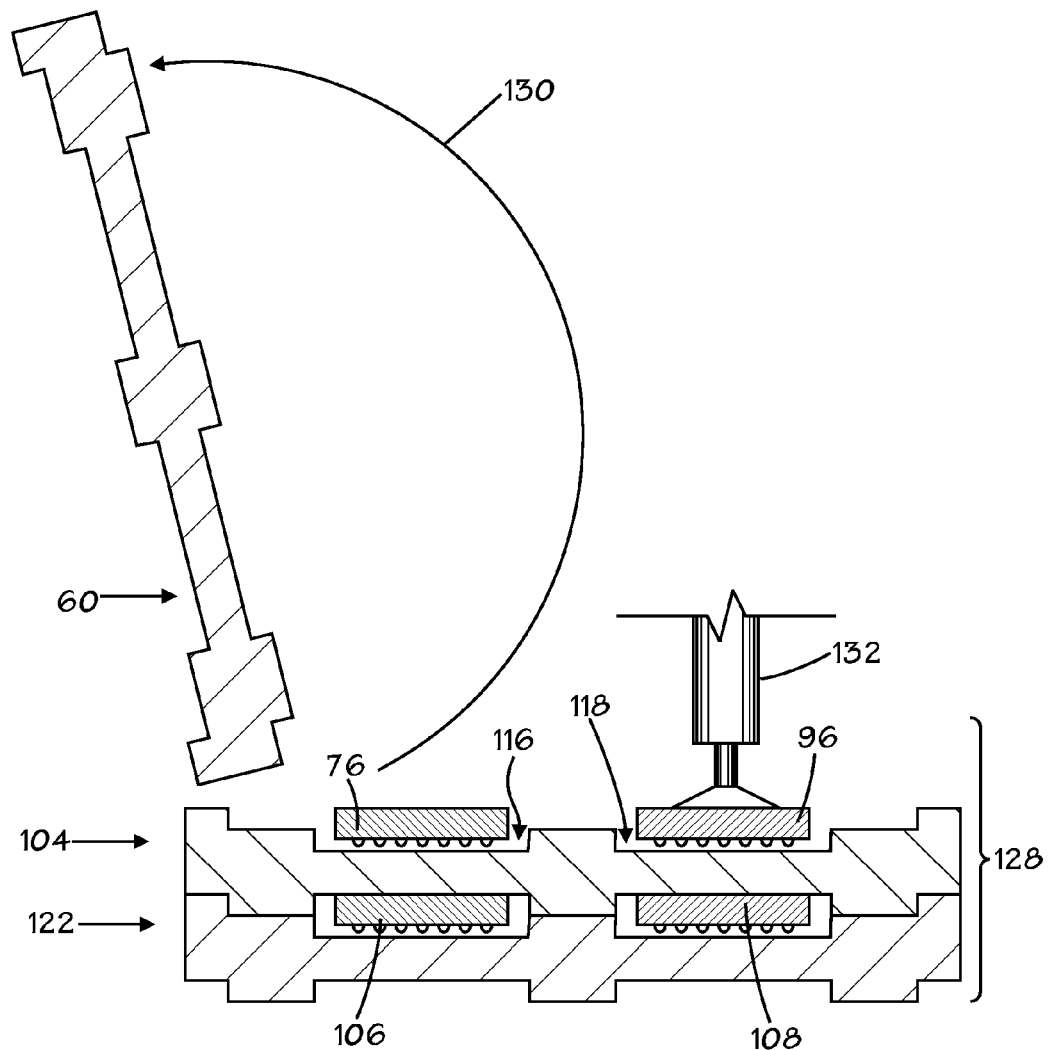
FIG. 18 is a sectional view depicting removal of the uppermost double-sided waffle pack and semiconductor die held thereby in accordance with the present invention.

Next, and as depicted in FIG. 18, the formerly bottom-most waffle pack 60 of the stack 128 may be peeled off the waffle pack 104 as suggested by the arrow 130 to expose the die 76 and 96. The die 76 and 96 may be removed from the respective cavities 116 and 118 of the waffle pack 104 by a pick and place mechanism 132. The next waffle pack 104 may thereafter be peeled away in the same fashion and the die 106 and 108 may be removed in the same way. After the die 76, 96, 106 and 108 are removed, they may undergo additional processing, such as packaging for example.

The skilled artisan will appreciate that the number, size, shape and arrangement of cavities in a waffle pack, such as the pack 60, may be varied. Virtually any shape suitable to hold a semiconductor chip may be used for the cavities. The arrangement of cavities may be array-like as depicted in the drawings or virtually any other configuration.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A waffle pack, comprising:
a body having a first side and second side opposite the first side, the first side having a first projection including a first cavity for enabling a semiconductor die to be seated therein when the body is in a first orientation, the second side having a second cavity including a third cavity nested therein, the second cavity adapted to stackably receive a second projection of another waffle pack, the third cavity for enabling a semiconductor die to be seated therein when the body is in a second orientation opposite the first orientation; and
the first cavity having a first footprint and the third cavity having a second footprint.

2. The waffle pack of claim 1, wherein the first and second footprints are rectangular.

3. The waffle pack of claim 1, wherein the first projection and the second projection are rectangular.

4. The waffle pack of claim 3, wherein the second cavity comprises a third footprint and the second projection of the another waffle pack comprises a fourth footprint that is substantially the same as the third footprint.

5. The waffle pack of claim 1, wherein the first projection comprises a third fourth cavity for enabling another semiconductor die to be seated therein when the body is in the first orientation.

6. The waffle pack of claim 5 wherein the second cavity comprises a fifth cavity nested therein for enabling another semiconductor die to be seated therein when the body is in the second orientation.

7. The waffle pack of claim 1, wherein the body comprises a plastic.

8. The waffle pack of claim 1, wherein the first and second footprints being substantially aligned vertically.

9. The waffle pack of claim 1, comprising a semiconductor chip positioned in one of the first and the third cavities.

10. A waffle pack, comprising:
a body having a first side and second side opposite the first side;
the first side of the body having a first plurality of cavities for enabling a corresponding plurality of semiconductor die to be seated in the first plurality of cavities when the body is in a first orientation;
the second side having a second plurality of cavities for enabling a second corresponding plurality of semiconductor die to be seated in the second plurality of cavities when the body is in a second orientation opposite the first orientation; and
the first and second pluralities of cavities forming pairs of cavities, one cavity in a given pair having a first footprint and the other cavity in the given pair having a second footprint, the first and second footprints being substantially aligned vertically.

11. The waffle pack of claim 10, wherein the first and second footprints are rectangular.

12. The waffle pack of claim 10, wherein the first side comprises a step.

13. The waffle pack of claim 12, wherein the second side comprises a cavity having substantially the same footprint as the step.

14. The waffle pack of claim 10, wherein the first side comprises a third cavity.

15. The waffle pack of claim 14, wherein the second side comprises a step having substantially the same footprint as the third cavity.

16. The waffle pack of claim 10, wherein the body comprises a plastic.

17. The waffle pack of claim 10, comprising a semiconductor chip positioned in one of the first plurality of cavities.

* * * * *